(12) United States Patent
Jen

(10) Patent No.: US 6,738,943 B1
(45) Date of Patent: May 18, 2004

(54) APPARATUS AND METHOD FOR COUNTING ERRORS IN AN OPTICAL COMPACT DISC STORAGE SYSTEM

(75) Inventor: Li-Huan Jen, Santa Clara, CA (US)

(73) Assignee: Zoran Corp., Sunnyvale, CA (US)

( * ) Notice: Subject to any disclaimer, the term of this patent is extended or adjusted under 35 U.S.C. 154(b) by 0 days.

(21) Appl. No.: 09/564,091

(22) Filed: May 3, 2000

(51) Int. Cl.[7] ............................................. H03M 13/00
(52) U.S. Cl. ....................................... 714/756; 714/704
(58) Field of Search .............................. 714/704, 755, 714/756, 784; 369/47.14, 53.36, 30.23

(56) References Cited

U.S. PATENT DOCUMENTS

| 4,821,254 A | * | 4/1989 | Satoh et al. | 369/53.36 |
| 5,517,471 A | * | 5/1996 | Ashinuma et al. | 369/13.02 |
| 5,907,526 A | * | 5/1999 | Alon et al. | 369/30.22 |
| 6,263,469 B1 | * | 7/2001 | Jang | 714/775 |

* cited by examiner

Primary Examiner—David Ton
Assistant Examiner—Mujtaba Chaudry
(74) Attorney, Agent, or Firm—Pennie & Edmonds LLP

(57) ABSTRACT

A method and system are disclosed for counting errors occurring within an optical compact disk system as data is read from an optically encoded compact disk. In a preferred embodiment error flag data are generated as errors occur within the optical compact disk system. From the error flag data, error flag bits corresponding to errors in reading information from an optically encoded disk are identified for further processing. Further processing includes, among other things, keeping a total count of errors, keeping a count of single occurring errors, keeping a count of multiple occurring errors. Furthermore, by keeping error count information, the operation of the optical compact disk system may be interrupted upon the exceeding of a predetermined threshold. From the error count information the hardware, software and firmware within the optical compact disk system is optimized for increased performance.

23 Claims, 7 Drawing Sheets

APPARATUS AND METHOD FOR COUNTING ERRORS IN AN OPTICAL COMPACT DISC STORAGE SYSTEM

BRIEF DESCRIPTION OF THE INVENTION

This invention relates generally to error detection and correction within an optical compact disk storage device. More particularly, this invention relates to a technique for counting errors of different types in an optical compact disk storage system.

BACKGROUND OF THE INVENTION

In the past, the production of compact disks (CDs) and compact disk-read only memories (CD-ROMs) was the exclusive domain of mass production compact disk facilities. Compact disk manufacturers employ sophisticated equipment and procedures to verify the reliability of their compact disks. As is well known in the compact disk industry, all disks generate errors regardless of the quality control used in recording.

Referring to FIG. 1, there is shown a block diagram of a compact disk player in accordance with the prior art. Note that throughout the present description and the figures, like reference numerals designate like parts. Compact disk players and their variations including compact disk-recordable (CD-R) players and compact disk-rewritable (CD-RW) players rotate an optically encoded disk 102 using motor 104. Optical pickup 106 consists of a laser that directs light onto disk 102. Light is then reflected off the disk 102 and received by an optical sensor on optical pickup 106. Electrical digital data is then produced responsive to the optical reflections. Such digital data is sent to pre-amplifier 108 which is further electrically coupled to a servo control device 110 and a microprocessor 112. Signals from the servo control device 110 are further directed to the motor 104 and optical pickup 106. The various devices as shown in FIG. 1 thereby form a closed loop system for reading and/or writing optically encoded data. Microprocessor 112 may further be coupled to sound or visual producing devices as may be appropriate.

In order to produce binary signals from the reflected light, pits are produced on disk 102 to change the reflectivity of the disk. In a typical compact disk system, the width of pits on a compact disk is smaller than the wavelength of the light being used to detect the pits, thus compact disk systems are operating near the limits of physics. In the system of FIG. 1, the optical pickup 106 must stay focused within a range of less than 4 microns while moving with respect to the disk in both a vertical and horizontal manner. The optical pickup 106 must follow a spiral track of pits as it reads digital data from the compact disk. The servo control device 110 is a highly tuned and sophisticated servo control system used to focus the optical pickup 106, follow the track on the disk 102, control the motor 104 and handle timing issues within the pre-amplifier 108 and microprocessor 112 related to reading the digital data. The servo control device 110 is very sensitive and operates within very tight tolerances. Thus, even with very good disk media and very good data, many errors can occur as a result of the narrow tolerances within the mechanical operation of devices within the compact disk unit. Dust and residue on the disk may also cause errors. Moreover, errors may be generated by faulty software or firmware used to operate the mechanical devices.

Prior art compact disk systems have utilized various methods of error detection and correction but have not made full use of further information provided by the error detection and correction codes. Conventional methods of error correction and detection include C1 and C2 coding. Such an implementation is based on Cross Interleave Reed-Solomon Coding (CIRC). Although prior art systems have used error detection and correction to detect and correct errors, prior art systems have not provided detailed and specific information regarding the types and numbers of specific errors. Furthermore, with the advent of affordable CDs created on one's desktop, there has been an increased need to provide a low-cost and convenient system of detecting the occurrence of errors and the determination of specific types of errors to further determine the source of the errors. Sources of errors can then be localized to the compact disk, the hardware used to read the data, the hardware used to write the data, or the digital source data among other things. Although blank CD-R and CD-RW media is tested at manufacturing facilities, such compact dick cannot be determined to be readable or writable until data is recorded to them. Thus there exists a need to make available to the average consumer a low-cost and reliable system that provides detailed error information that can be readily used to optimize the performance of a compact disk unit.

Those skilled in the art are fully aware that writing and reading data associated with compact disks is inherently error-prone because the pits on a compact disk are so small. For this reason, sophisticated error detection and correction codes are used. Typically such error correction and detection codes make use of redundancy and interleaving to ensure that errors can be corrected.

Error correction and detection is not, however, the cure-all in compact disks. The compact disk media does not operate in a vacuum, instead the compact disk media operates in conjunction with a disk motor, optics, and other associated hardware. Thus, where the integrity of the disk media is sound, errors can nonetheless occur if the accompanying hardware or software is defective.

The two primary features of the compact disk that can cause errors include pit geometry and physical defects. Pit geometry refers to the depth, width, length, and wall slope of the physical pits created in the disk. Although CD-R disks do not have pits, the recording process produces areas on the disk that function like pits which are subject to imperfections that cause errors. Physical defects include pinholes, black spots, bubbles and scratches. Poor pit geometry and physical defects can make it very difficult for the servo 110 mechanisms to read data properly; A determination can often be made as to whether problems are caused by pit geometry or local defects from error information. A burst of large errors confined to a small part of the disk is most likely caused by some kind of local disk defect. Large errors found over the entire disk or a large portion of the disk can be attributed to poor pit geometry. Large errors throughout the disk may also be indicative of a poorly optimized servo control system.

Error detection and correction codes can correct certain types of data errors. However, to the extent that errors can be minimized by optimizing a compact disk system, such error detection and correction codes will find reduced use resulting in an overall improvement of compact disk performance. For example, certain data errors may indicate the existence of a hardware problem as distinguished from an error encoded on the disk 102. Thus, a main purpose of the present invention is to prevent errors from ever occurring.

In view of the foregoing, it would be highly desirable to provide a technique for counting errors and for counting error rates in an optical compact disk storage system to facilitate operations and to reduce errors in the optical compact disk storage system.

SUMMARY OF THE INVENTION

One embodiment of the invention is a system for providing information on errors occurring in an optical compact disk unit used for reading data from an optical disk media. The system includes a demultiplexer that receives a stream of multiplexed error flag signals and outputs a stream of demultiplexed error flag signals. Coupled to the demultiplexer is a decoder that decodes at least a portion of the stream of demultiplexed error flag signals, detecting errors of a predetermined type. An error counter then keeps a count of the errors and a register stores the number of errors of the predetermined type.

Another embodiment of the present invention includes a threshold count register that stores a predetermined threshold count value and a comparator coupled to the threshold count register. When the error count exceeds the predetermined threshold count value, predetermined operations within the compact disk unit may be altered or halted. The predetermined operations may be altered to optimize hardware, software or firmware operations. Alternatively, the entire operation of the compact disk unit may be halted until any problems are corrected.

Another embodiment of the invention is a system for providing information on error rates occurring in an optical compact disk unit used for reading data from an optical disk media. The system includes an error detector that identifies the occurrence of an error in a stream of multiplexed error signals. Coupled to the detector is an error rate counter coupled to a first clocking signal such as a frame clocking signal. An error rate count register then calculates and stores an error rate count upon the occurrence of a second clocking signal such as a sector synchronization signal. Furthermore, the error rate is calculated over a time period proportional to a characteristic of the second clocking signal.

Another embodiment of the present invention includes a threshold rate register that stores a predetermined threshold rate value and a comparator coupled to the threshold rate register. When the error rate exceeds the predetermined threshold count value, predetermined operations within the compact disk unit may be altered or halted. The predetermined operations may be altered to optimize hardware, software or firmware operations. Alternatively, the entire operation of the compact disk unit may be halted until any problems are corrected.

By counting errors and generating error rates, serious or recurring problems within a compact disk unit, be it hardware, software or firmware related, can be detected and corrected. The occurrence of errors and the rate of such occurrences are used in the present invention as a parameter for enhancing the performance of a compact disk system.

BRIEF DESCRIPTION OF THE DRAWINGS

The above and other objects, features and advantages of the present invention will be more clearly understood from the following detailed description taken in conjunction with the accompanying drawings where.

DETAILED DESCRIPTION OF THE PREFERRED EMBODIMENT

Figure 1:
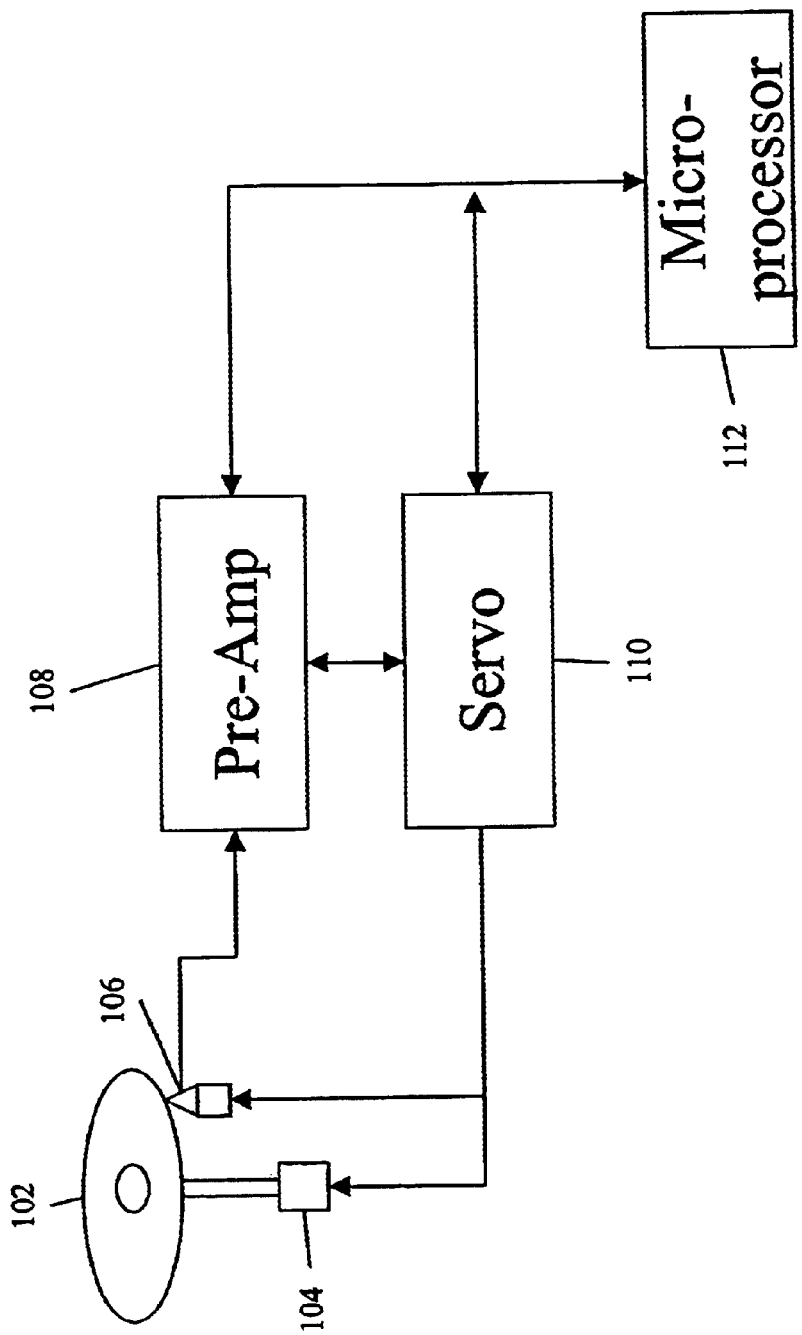
FIG. 1 is a block diagram of a compact disk system constructed in accordance with the prior art.
Figure 2:
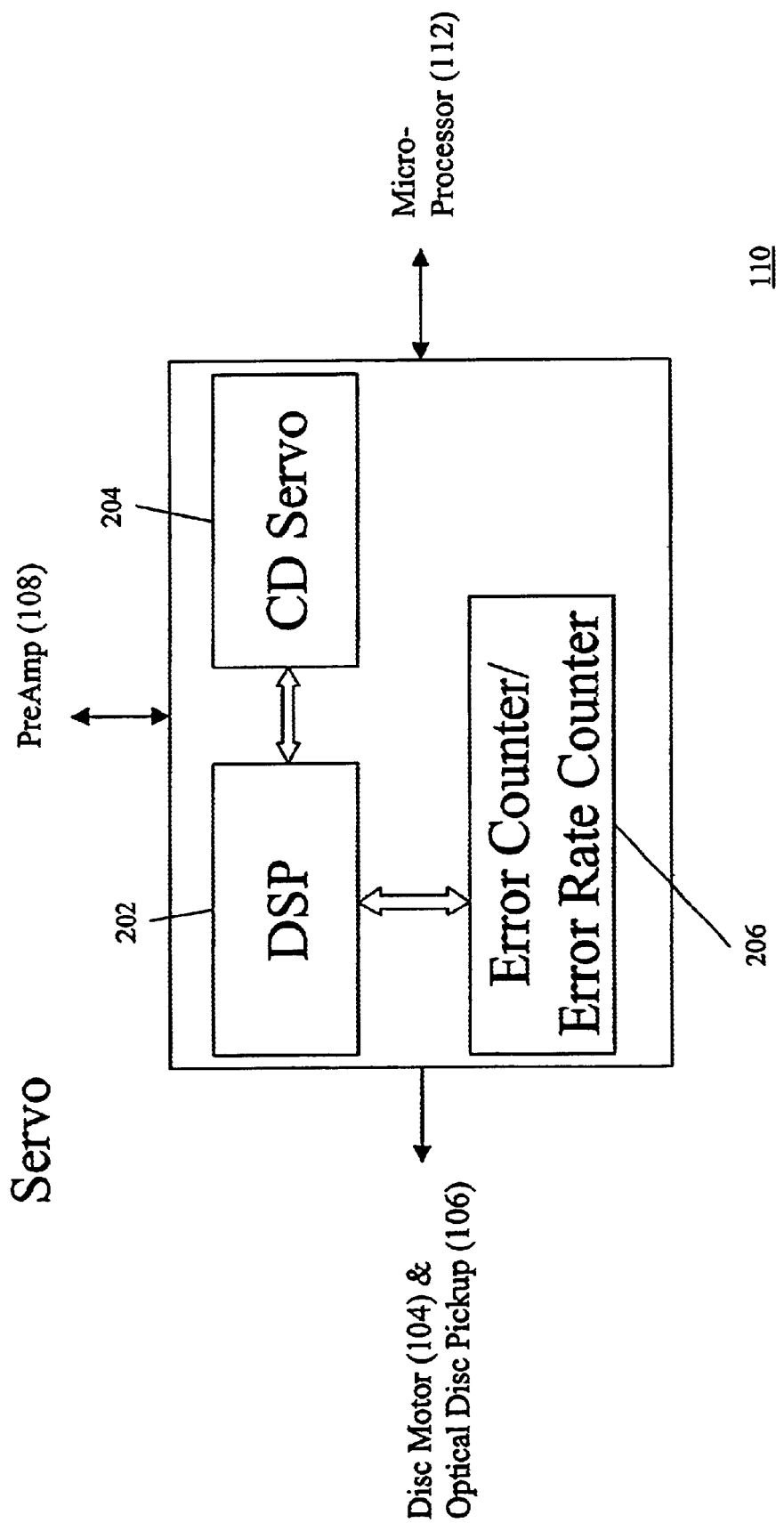
FIG. 2 is a block diagram of components of a servo system that may be used in accordance with an embodiment of the invention.

FIG. 2 illustrates a servo 110 utilized in accordance with an embodiment of the invention. The servo 110 may be incorporated into the prior art system of FIG. 1. Contained within servo 110 is DSP 202 used to process the digital signals received from the preamplifier 108 and microprocessor 116. Furthermore, DSP 202 is coupled to CD servo 204, where CD servo 204 is designed to process signals relating to the control of the speed of motor 104 as a function of optical pickup 106 information. Finally, the error counter 206 is coupled to the DSP 202.

Compact disks typically use a type of error correction and detection known as Cross-Interleaved Reed-Solomon Code (CIRC). CIRC applies two levels of error correction known as C1 and C2. The detectable and correctable errors derive from these two levels of error correction. CIRC employs two principles, redundancy and interleaving, to detect and correct errors. CIRC employs approximately 25% data redundancy whereby the data is laid out in such a manner that allows errors to be corrected even though less than 100% of the data is redundant. In its redundancy scheme, CIRC uses a parity checking algorithm to reproduce data that contains errors.

In employing an interleaving scheme, CIRC distributes data over a relatively large physical disk area. The data is interleaved during recording and is de-interleaved during reading. Typical systems interleave one frame of 24 bytes of data over 109 blocks. To destroy one byte of data, the other bytes would also have to be destroyed. With scratches, dust, fingerprints, and even holes in the disk, there is usually enough data remaining to reproduce any data that may have been damaged or lost.

In general, the C1 level of CIRC is meant to correct small, random errors while the C2 level is meant to correct larger errors and bursts of errors. C1 is the first level of error correction and detection used in compact disk systems. Errors at level one are indicated as E11, E21, and E31 indicating one, two, and three errors, respectively, within a frame. Note that the first digit (right-most digit) indicates the level of error correction and detection (i.e., level 1) and the second digit indicates the number of errors (i.e., one, two, etc.). C1 can correct one and two errors (i.e. E11 and E21) but cannot correct three errors (i.e. E31).

C2 is the second level of error correction and detection used in compact disk systems. Errors within a frame at level two are indicated as E12, E22, E32, E42, E52 and E62. One through 4 errors are indicated as E12 through E42 following the same convention as C1, however, E52 indicates that the errors are uncorrectable because more than 4 errors have occurred and E62 indicates that the entire C2 frame is uncorrectable. Typically for CD-ROM systems, three or more errors within a frame are unacceptable because an uncorrectable error in computer data can have a devastating effect on a computer system. Furthermore, mastering facilities will typically abort on the occurrence of an uncorrectable error on input media. Other CD-ROM systems attempt to correct more than 3 errors, however, the occurrence of such number of errors may be indicative of an impending failure or loss of data. Any further deterioration of the disk media may mean the end of usable data. With this general understanding of CIRC and C1/C2 error correction and detection, the present invention will be described in further detail.

The rate of occurrence of errors is also useful in optimizing the performance of a compact disk unit. The concept of a block error rate (BLER) is defined as the number of data blocks per second that have any bad symbols. BLER is thus a general measurement of the quality of a disk. Certain disk specifications (i.e., International Electrotechnical Commission's IEC 908) call for a maximum BLER of 220 errors per second averaged over ten seconds. Disks with higher BLER are likely to produce uncorrectable errors. BLER is also used as a measure of system performance where a low BLER indicates a well performing system. BLER, however, has its limitations because it does not indicate the severity of the errors. As measured by BLER a single error and an uncorrectable error within a block are treated the same for purposes of the calculation of the block error rate. Thus, no distinction is made between, for example, 220 correctable errors per second and 220 uncorrectable errors per second. The present invention, however, as will be shown below, can distinguish between single, multiple or uncorrectable errors to provide useful information in optimizing the compact disk unit.

In a preferred embodiment of the present invention, C1 and C2 error flags are created to indicate the type of error within the respective coding. The C1 and C2 error flag signals are part of other error flags created within the compact disk system. In an embodiment, error flag data is carried on a multiplexed stream of 24 bits, Eflg23:0, where C1 and C2 are carried on bits 7 through 11 (ie., Eflg11:7) of the larger error flag signal. The C1 and C2 errors are summarized in the following table.

| Eflg11 | Eflg10 | Eflg9 | Eflg8 | Eflg7 | DESCRIPTION |
|---|---|---|---|---|---|
| 0 | 0 | X | X | X | C1 frame contains no errors |
| 0 | 1 | X | X | X | C1 frame contains 1 error |
| 1 | 0 | X | X | X | C1 frame contains 2 errors |
| 1 | 1 | X | X | X | C1 frame uncorrectable |
| X | X | 0 | 0 | 0 | C2 frame contains no errors |
| X | X | 0 | 0 | 1 | C2 frame contains 1 error |
| X | X | 0 | 1 | 0 | C2 frame contains 2 errors |
| X | X | 0 | 1 | 1 | C2 frame contains 3 errors |
| X | X | 1 | 0 | 0 | C2 frame contains 4 errors |
| X | X | 1 | 1 | 0 | C2 frame uncorrectable more than 4 errors |
| X | X | 1 | 1 | 1 | C2 frame uncorrectable entire c2 frame |

Figure 3:
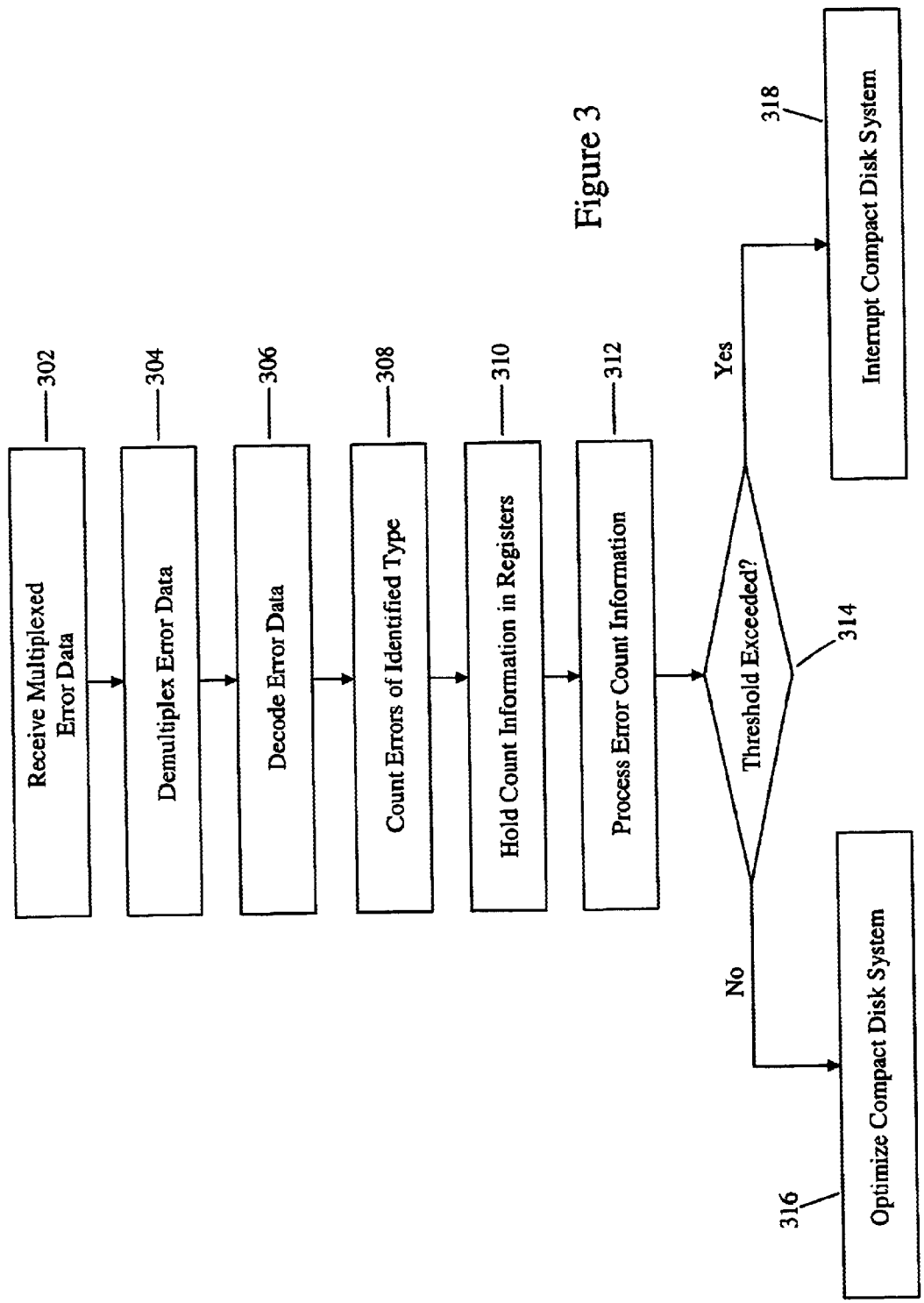
FIG. 3 is a flowchart of a method of counting errors in accordance with an embodiment of the present invention.

In a particular embodiment, the error counter of the present invention is uniquely configured to provide enhanced error analysis derived from C1 and C2 error detection and correction codes. FIG. 3 provides a flowchart of the various functions performed by the error counter of the present invention. Multiplexed encoded error data is received at step 302. The multiplexed data is then demultiplexed at step 304 to produce a number of demultiplexed bits of data corresponding to the C1 and C2 error correction and detection codes. The demultiplexed error data is then decoded at step 306 to identify the particular type of errors that may have occurred. At step 306, C1 and C2 errors are distinguished as well as the number of errors within each error detection and correction scheme. When a particular type of error is detected, a counter is incremented at step 308 thus identifying an error of a specific type. At step 310, error count data is registered for the various frames as they are being read by the compact disk system. The registered error information is then directed to other hardware and software for processing as shown in step 310. Within the compact disk system so as to improve the overall performance of the compact disk system. Error register data is made available to the DSP 202, preamplifier 108 and microprocessor 112 in making efficient use and control of the compact disk system. Where recurrence of particular types of errors are identified, such information is used to further control and optimize the compact disk system.

In a preferred embodiment, thresholds for numbers of errors or errors of a particular type are set. At step 314, the error information for the compact disk system is compared to the predetermined threshold. If the threshold is exceeded, an interrupt signal is generated that interrupts some or all of the operations within the compact disk system as shown at step 318. The operations interrupted may be either hardware or software related. For example, upon exceeding a threshold value, a hardware interrupt signal may be sent to the servo 110 indicating that servo or control components within the compact disk unit are not operating properly. At this point, an operator may then take appropriate steps to correct the problem. In another example, upon exceeding a threshold value, a software interrupt signal may be generated so as to halt certain operations and, if desired, initiates other operations. In reading information for executable code and upon the occurrence of too many errors, the system may halt further reading of the code and then initiates a system optimization routine before again attempting to read in the executable code. If the threshold is not exceeded, the error information can still be used to optimize the compact disk system as shown at step 316. For example, a compact disk unit may experience many occurrences of single C2 errors. The C2 error correction scheme can restore the original data, but at the cost of increased processing. Upon the observance of many occurrences of single bit C2 errors, however, the present invention can be used to initiate corrective measures in either hardware or software. Corrective measures may include implementing a different servo control feedback system or reducing the disk rotation speed, for example.

In another embodiment of the invention, count information at step 308 is reset for every frame received from a compact disk. On a compact disk, a sector is composed of 24 bytes of data plus 4 bytes for C1 error detection and correction plus another 4 bytes for C2 error detection and correction. In this way C1/C2 error detection and correction constitutes 25% overhead (i.e., 8 bytes/32 bytes). Within each such sector, there are 98 frames. Data is read at a rate of 75 sectors per second. Upon the completion of a frame, counter data is cleared so as to enable the error counter of the present invention to process information relating to further frames.

Figure 4:
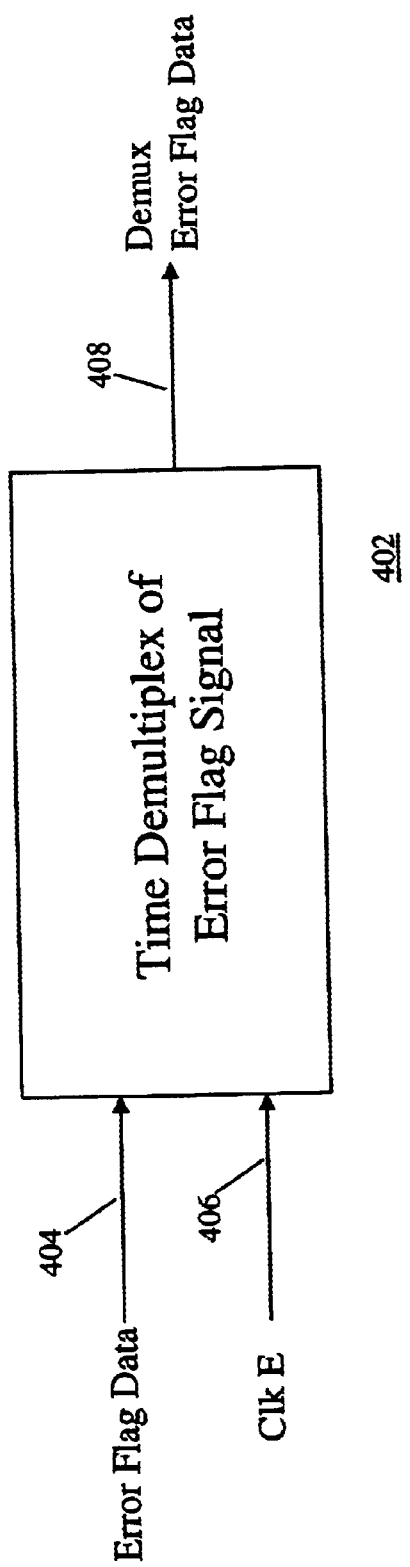
FIG. 4 is block diagram of a demultiplexer as used in an embodiment of the present invention.

FIG. 4 is a block diagram of a demultiplexer in a preferred embodiment of the error counter of the present invention. Demultiplexer 402 receives error flag data from a multplexed stream on bus 404. Demultiplexer 402 is able to identify error flag data in response to an error clock signal (Clk E) on line 406. Although many schemes exist, the present invention makes use of error flag bits 7 through 11 (i.e., Eflg11:7) in an error stream (i.e., Eflg23:0) as shown in the table above. Error flag bits 7 through 11 are used by C1 and C2 error detection and correction schemes where bits 10 and 11, identified as Eflg10 and Eflg11 respectively, are used for C1 error detection and bits 7 through 9 are used for C2 error detection, identified as Eflg7 through Eflg9 (see table above). In a particular embodiment of the preferred invention, Eflg11:7 are output in parallel form. That is to say, a large serially multiplexed stream of data is input into demultiplexer 402 and the same information is output in parallel form. It will be obvious to one skilled in the art to implement demultiplexer 402 in other forms. For example demultiplexer 402 may be implemented to filter only the error flag bits of interest. In this way, error flag bits Eflg11:7 can be output in a shortened multiplexed form and then processed as will be further described below.

Figure 5:
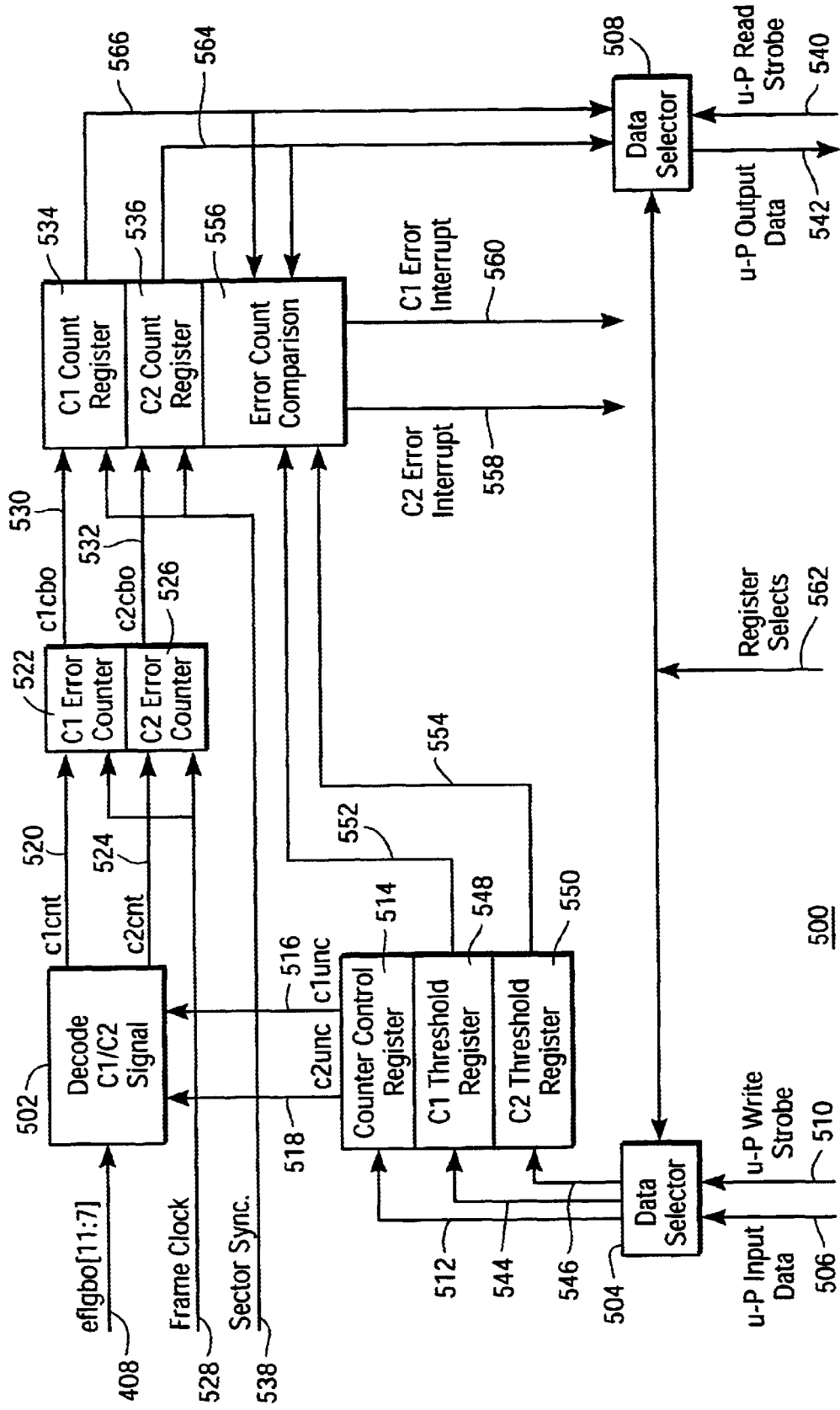
FIG. 5 is block diagram of an error counter as used in an embodiment of the present invention.

Referring now to FIG. 5, the demultiplexed error data (i.e., Eflg11:7) on bus 408 is fed into decoder 502. Decoder 502 may be implemented in various forms. For example, in one embodiment, decoder 502 may be implement to detect C1 and C2 errors individually. In the embodiment shown in FIG. 5, decoder 502 detects and counts the number of errors within C1 and C2, respectively or collectively. As shown in FIG. 5, write data selector 504 receives signals from the microprocessor 1112 (see FIG. 1) in the form of microprocessor input data on line 506 and from read data selector 508. Such signals are accepted by the data selector upon the occurrence of a microprocessor write strobe on line 510. Data selector decoder signal on line 512 is then sent to the counter control register 514. In turn, counter control register 514 sends an appropriate signal (i.e., C1unc) on line 516 to decoder 502 to process particular types of C1 errors. For example, the signal on line 516 may designate that counting should be done when the C1 frame contains 1 error. Alternatively, the same could be done witch the C1 frame contains 2 errors or is uncorrectable. Furthermore, counter control register 514 sends an appropriate signal (i.e., C2unc) on line 518 to decoder 502 to process particular types of C2 errors. In this manner, the microprocessor 112 controls the type of errors, either C1 and/or C2, as well as the numbers of errors within each error type that decoder 502 will process.

Upon the occurrence of C1 errors of an identified type, an appropriate C1 count-up signal on line 520 is sent to C1 error counter 522. Similarly, C2 count-up signal on line 524 is applied to a C2 error counter 526. C1 error counter 522 and C2 error counter 526, however, do not increment until the occurrence of a frame clock signal on line 528. Upon the occurrence of frame clock signal on line 528, C1 total count signal 530 and C2 total count signal 532 are incremented as necessary and are sent to C1 count register 534 and C2 count register 536, respectively. C1 count register 534 and C2 count register 536 maintain error count information for particular sectors in response to the sector synchronization signal on line 538. C1 count register 534 and C2 count register 536 in turn send information to data selector 508. Upon the occurrence of a microprocessor read strobe signal on line 540, data selector 508 sends error count information to the microprocessor via microprocessor output data signal on line 542. After error count information is sent to the microprocessor such information is further directed to the firmware being used to optimize the performance of the compact disk system. For example, upon the occurrence of a predetermined number of certain types of errors, error count information is used to determine which block of data is defective within a computer disk media among other things.

The compact disk system may be optimized through hardware or software modifications. For example, upon exceeding a threshold value, a hardware interrupt signal may be sent to the servo 110 indicating that servo or control components within the compact disk unit are not operating properly. At this point, an operator may then take appropriate steps to correct the problem. In another example, upon exceeding a threshold value, a software interrupt signal may be generated so as to halt certain operations and, if desired, initiate other operations. In reading information for executable code and upon the occurrence of too many errors, the system may halt further reading of the code and then initiate a system optimization routine before again attempting to read in the executable code. If the threshold is not exceeded, the error information can sun be used to optimize the compact disk system as shown at step 316 (FIG. 3). For example, a compact disk unit may experience many occurrences of single C2 errors. The C2 error correction scheme can restore the original data, but at the cost of increased processing. Upon the observance of many occurrences of single bit C2 errors, however, the present invention can be used to initiate corrective measures in either hardware or software. Corrective measures may include implementing a different servo control feedback system or reducing the disk rotation speed, for example.

The error counter of the present invention as shown in FIG. 5 has some further enhancements. It is desirable to interrupt a compact disk system upon the occurrence of a certain number of errors, either C1 and/or C2, or upon the occurrence of a certain number of error types (i.e. 12 different occurrences of C1 errors). As shown in FIG. 5, C1 threshold register 548 and C2 threshold register 550 hold a threshold value for particular numbers of errors of an identified type. Such errors are identified by first selecting which register 548 and/or 550 is to be active by means of a register select signal on line 562. The register select signal on line 562 is directed to data selector 504. The microprocessor 112 may further provide threshold information at the microprocessor input data signal on line 506. Threshold and register information is then sent upon the occurrence of a microprocessor write strobe signal on line 510 from data selector 504 by means of a C1 threshold signal on line 544 and a C2 threshold signal on line 546 to C1 threshold register 548 and C2 threshold register 550. In turn, a C1 threshold register signal on line 552 and a C2 threshold register signal on line 554 are directed to error count comparator 556. Error count comparator 556 compares such signals to the C1 count register signal on line 566 and the C2 count register signal on line 564 as appropriate. Upon the occurrence of a predetermined threshold being exceeded, either a C1 error interrupt signal on line 560 or a C2 error interrupt signal on line 558 is generated to halt or alter the operation certain components within the compact disk system.

Error rate information, as well as error count information, is valuable to firmware as well as hardware and software supporting a compact disk system. With further error rate information, a compact disk system is better able to adjust and optimize its various read channel parameters.

Figure 6:
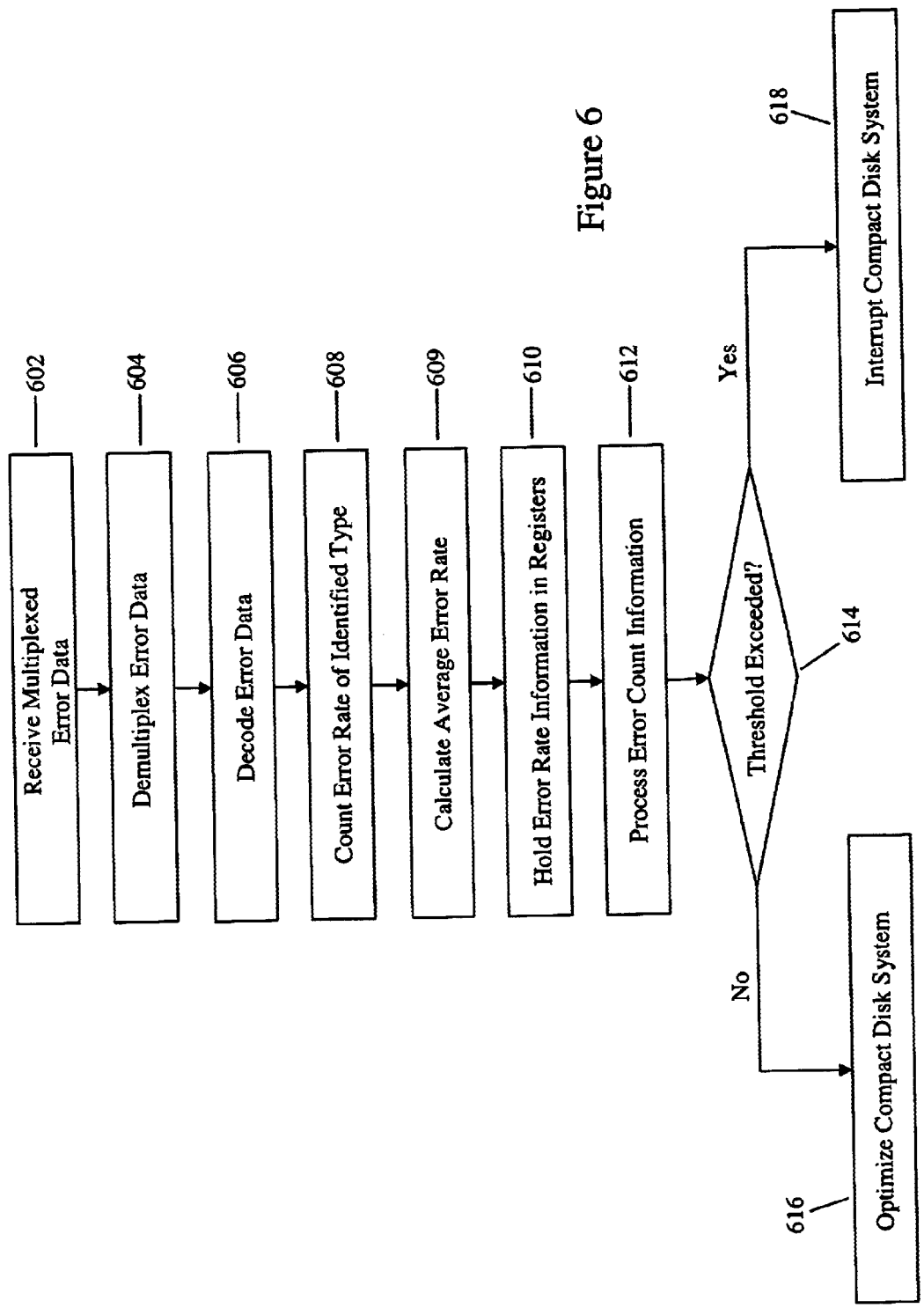
FIG. 6 is a flowchart of the method of counting error rates in accordance with an embodiment of the present invention.

In a particular embodiment, the error rate counter of the present invention is uniquely configured to provide an enhanced error rate analysis derived from C1 and C2 error detection and correction codes. FIG. 6 provides a flow block of the various functions performed by the error rate counter of the present invention. Multiplexed encoded error data is received at step 602. The multiplexed data is then demultiplexed at step 604 to produce a number of demultiplexed bits of data corresponding to the C1 and C2 error correction and detection codes. The demultiplexed error data is then decoded at step 606 to identify the particular type of errors that may have occurred. At step 606, C1 and C2 errors are distinguished as well as the number of errors within each error detection and correction scheme. When a particular type of error is detected, a counter is incremented at step 608 thus identifying an error of a specific type. At step 609, an average error rate over a specified time is calculated. In an embodiment of the invention, an average error rate is calculated over a time period required to read one sector of data. Alternatively, an average error rate is calculated over a time period required to read several sectors of data. Furthermore, as described above, there exists a relationship between frames and sectors such that error rates may further be calculated over subdivisions of sectors. Thus, there is provided error rate information averaged over an entire sector, various sectors or subdivisions of sectors as may be necessary in a particular application.

At step 610, error rate data is registered for the various sectors as they are being read by the compact disk system. The registered error rate information is then directed to other hardware and software for processing as shown in step 612 within the compact disk system so as to improve the overall performance of the compact disk system. Error rate register data is made available to the DSP 202, preamplifier 108 and microprocessor 112 in making efficient use and control of the compact disk system. Where recurrence of particular types of errors is identified, such information is used to further control and optimize the compact disk system.

In a preferred embodiment, a threshold is set for overall error rates or error rates of a particular type. At step 614, the error rate information for the compact disk system is compared to the predetermined threshold. If the threshold is exceeded, an interrupt signal is generated that interrupts some or all of the operations within the compact disk system as shown at step 618. The operations interrupted may be either hardware or software related. If the threshold is not exceeded, the error information can still be used to optimize the compact disk system as shown at step 616.

In another embodiment of the invention, error rate information at step 608 is reset for every sector received from a compact disk. Furthermore, timing information is derived from a sector signal itself so as to calculate an error rate over a sector, a number of sectors or even subdivisions of sectors such as frames. In an embodiment of the invention, upon the completion of a sector, or some other predetermined interval, counter data is cleared so as to enable the error rate counter of the present invention to process information relating to subsequent sectors. It will be obvious to one skilled in the art to use other references of time or data for resetting the counter.

Figure 7:
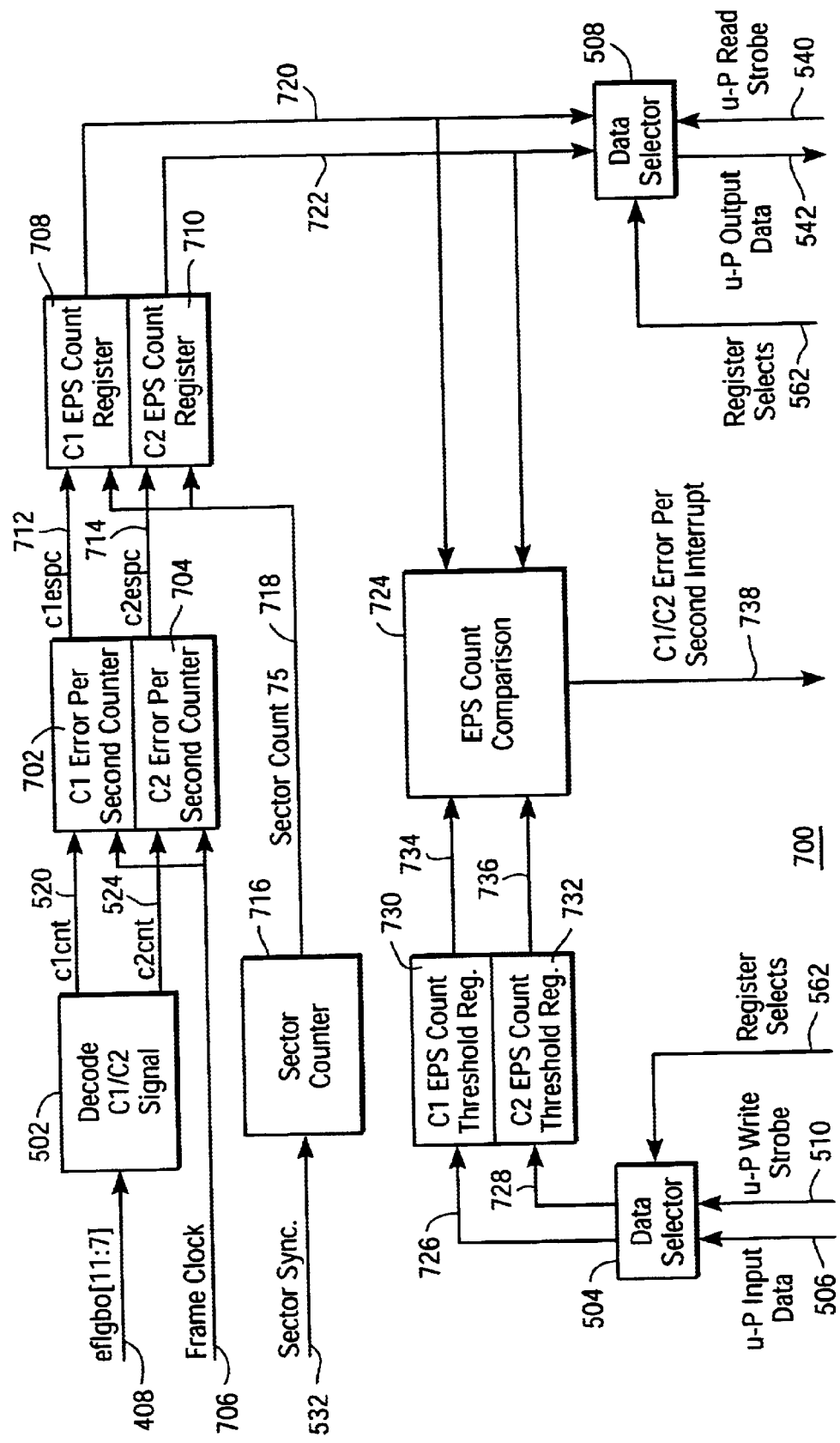
FIG. 7 is block diagram of an error rate counter as used in accordance with an embodiment of the present invention.

The error rate counter of the present invention has as a preliminary stage a demultiplexer as shown in FIG. 4. The operation of demultiplexer 402 is as described above. Referring now to FIG. 7, the demultiplexed error data 404 (i.e., Eflg11:7) is then fed into decoder 502. Decoder 502 may be implemented in various forms as previously described for FIG. 5. Upon the occurrence of C1 errors of an identified type, an appropriate C1 count-up signal on line 520 is sent to C1 error per second (EPS) counter 702. Similarly, a C2 count-up signal on line 524 is applied to the C2 error per second counter (EPS) 704. C1 EPS counter 702 and C2 EPS counter 704 increment on the occurrence of frame clock signal on line 528.

C1 EPS counter 702 and C2 EPS counter 704 are configured to be responsive to a frame clock signal on line 706. Such count information is directed to C1 EPS count register 708 and C2 EPS count register 710 by means of C1 EPS rate signal on line 712 and C2 EPS rate signal on line 714, respectively. At registers 708 and 710, an average error rate is calculated through the use of sector timing information. Upon the occurrence of a sector synchronization signal on line 532, sector counter 716 is incremented. In an embodiment of the invention, a sector counter signal is sent on line 718 to C1 EPS count register 708 and C2 EPS count register 710 upon every occurrence of a sector synchronization signal. In another embodiment, a sector count signal on line 718 is sent to C1 EPS count register 708 and C2 EPS count register 710 upon the occurrence of a predetermined number of sector synchronization signals on line 532. In this manner, an error rate is averaged over a predetermined time period. With such information, C1 EPS count register 708 generates a C1 error rate signal on line 720. A C2 error rate signal on line 722 is generated similarly on line 722. C1 EPS register signal on line 720 and C2 EPS register signal on line 722 are fed into data selector 508 which also receives register select signal on line 562. Register select signal 562 identifies which error rate signal will be sent to the microprocessor. Upon the occurrence of a microprocessor read strobe signal on line 540, error rate information of the desired type is sent to the microprocessor through the microprocessor output data signal on line 542. The error rates are used by firmware, hardware or software so as to analyze the performance of the optical disk system where, for example, a constant high error rate may indicate a problem with the firmware. Alternatively, "bursty" high error rates may indicate problems with the disk media or other hardware.

In an embodiment of the preferred invention, it is desirable to interrupt certain operations of a compact disk system upon exceeding a predetermined threshold rate. The C1 EPS register signal on line 720 and the C2 EPS register signal on line 722 are therefore also fed into error per second (EPS) count comparator 724. As shown in FIG. 7, C1 error per second (EPS) threshold register 730 and C2 EPS threshold register 732 hold a threshold value for particular rates of an identified type. Such error rate thresholds are identified by first selecting which register 730 and/or 732 is to be active by means of a register select signal on line 562. The register select signal on line 562 is directed to data selector 508. The microprocessor 112 may further provide threshold information by means of the microprocessor input data signal on line 506. EPS threshold and register information is then sent upon the occurrence of a microprocessor write strobe signal on line 510 from data selector 508 by means of a C1 EPS threshold signal on line 726 and a C2 EPS threshold signal on line 728 to C1 EPS threshold register 730 and to C2 EPS threshold register 732, respectively. In turn, C1 EPS threshold register signal on line 734 and C2 EPS threshold register signal on line 736 are directed to EPS count comparator 724. EPS count comparator 724 compares the threshold level signals to the C1 EPS register signal on line 720 and the C2 EPS register signal on line 722, as appropriate. Upon the occurrence of a predetermined threshold being exceeded, a C1/C2 EPS Interrupt signal on line 738 is directed to the compact disk system so as to alter predetermined operations. The occurrence of a high error rate is indicative of firmware, hardware or software problems that would make further operation potentially useless. Alteration and optimization of the compact disk system may be achieved as previously described. In another embodiment of the present invention, the C1/C2 EPS interrupt signal on line 738 is output as two signals—one for each type of error.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An error counting system for providing the information on errors occurring in an optical compact disk system used for reading data from an optical disk media, comprising:
  a demultiplexer to receive a stream of multiplexed error flag signals and produce a stream of demulitplexed error flag signals, wherein at least a portion of the stream of multiplexed error flag signals is derived from a Cross-Interleaved Reed-Solomon Code;
  a decoder, coupled to the demultiplexer, that decodes at least a portion of the stream of demultiplexed error flag signals thereby detecting occurrences of at least one error type, wherein the at least one error type is derived from C1 error detection or C2 error detection;
  at least one error counter corresponding to the at least one error type, the at least one error counter being incremented responsive to the occurrence of the at least one error type and upon the presence of a first clocking signal; and
  at least one error count register storing at least one error count determined from the at least one error counter;
  wherein the optical compact disk system is configured to respond to the at least one error count by initiating a correction to the optical compact disk system, the correction comprising corrections hardware and/or software corrections to the optical compact disk system.

2. The error counting system as in claim 1, wherein the at least one error counter is responsive to a reset clock signal, which resets the at least one error counter.

3. The error counting system as in claim 1, further comprising at least one counter control register coupled to the decoder, the counter control register identifying the at least one error type.

4. The error counting system as in claim 1, wherein the at least one error count register is further responsive to a second clocking signal.

5. The error counting system as in claim 1, further comprising:
  at least one threshold register storing a predetermined threshold value; and
  at least one comparator coupled to the at least one error count register and the at least one threshold register, the at least one comparator performing a comparison, outputting at least one interrupt signal upon the at least one error count exceeding the predetermined threshold value, the at least one interrupt signal altering predetermined operations performed by the optical compact disk system; the altered predetermined operations comprising operations hardware and/or software operations.

6. The error counting system as in claim 5, wherein altering predetermined operations performed by the optical disk system includes one or more of the following:
  sending a hardware interrupt signal to a control component within the compact disk system;
  sending a software interrupt signal to halt an operation and initiate a system optimization routine.

7. The error counting system as in claim 5, wherein if the at least one error count does not exceed the predetermined threshold value, a corrective measure is initiated in hardware or software in the optical compact disk system.

8. The error counting system as in claim 7, wherein the corrective measure includes a change to a servo control feedback system or a reduction of disk rotation speed.

9. An error counting system for providing information on errors occurring in an optical compact disk system used for reading data from an optical disk media, comprising:
  a demultiplexer to receive a stream of multiplexed error flag signals and produce a stream of demultiplexed error flag signals;
  a decoder, coupled to the demultiplexer, that decodes at least a portion of the stream of demultiplexed error flag signals thereby detecting occurrences of at least one error type derived from a Cross-Interleaved Reed-Solomon Code, wherein the at least one error type is derived from C1 error detection or C2 error detection;
  a counter control register coupled to the decoder, the counter control register identifying the at least one error type;
  an error counter corresponding to the at least one error type, the error counter being incremented responsive to the occurrence of the at least one error type and upon the presence of a first clocking signal; and
  an error count register storing an error count determined from the at least one error counter;
  wherein the optical compact disk system is configured to respond to the at least one error count by initiating a correction to the optical compact disk system, the correction comprising corrections ether than corrections hardware and/or software corrections to the optical compact disk system.

10. The error counting system as in claim 9, further comprising:
  a threshold register storing a predetermined threshold value; and
  a comparator coupled to the error count register and the threshold register, the comparator performing a comparison upon the presence of a second clocking signal, outputting an interrupt signal upon the error count exceeding the predetermined threshold value, the interrupt signal altering selected operations performed by the optical compact disk system; the altered selected operations comprising operations hardware and/or software operations of the optical compact disk system.

11. The error counting system as in claim 10, wherein altering selected operations performed by the optical disk system includes one or more of the following:
  sending a hardware interrupt signal to a control component within the compact disk system; and
  sending a software interrupt signal to halt an operation and initiate a system optimization routine.

12. The error counting system as in claim 10, wherein if the at least one error count does not exceed the predetermined threshold value, a corrective measure is initiated in hardware or software in the optical compact disk system.

13. The error counting system as in claim 12, wherein the corrective measure includes a change to a servo control feedback system or a reduction of disk rotation speed.

14. A method for providing information on errors occurring within an optical compact disk system used for reading data from an optical disk media, comprising the steps of:

receiving a stream of multiplexed error flag signals containing information corresponding to at least one error detection scheme, wherein said receiving step includes the step of receiving multiplexed error flag signals derived from a Cross-Interleaved Reed-Solomon Code;

demultiplexing the stream of multiplexed error flag signals;

generating demultiplexed error flag signals;

decoding at least a portion of the demultiplexed error flag signals corresponding to the at least one error detection scheme, wherein the at least one error type is derived from C1 error detection or C2 error detection;

counting the occurrence of at least one error type upon the presence of a first clocking signal;

storing at least one error count; and responding to the at least one error count by initiating a correction to the optical compact disk system, wherein the correction comprises hardware and/or software corrections.

15. The method of claim 14, further comprising the step of periodically resetting the at least one error counter.

16. The method of claim 14, further comprising the steps of:

storing at least one preset threshold value;

comparing the at least one error count to the at least one threshold value;

generating at least one interrupt signal upon the at least one error count exceeding at least one preset threshold value; and altering selected operations performed by the optical compact disk unit; the step of altering selected operations comprising altering hardware and/or software operations of the optical compact disk unit.

17. The method of claim 16, wherein altering selected operations performed by the optical disk system includes one or more of the following:

sending a hardware interrupt signal to a control component within the compact disk system;

sending a software interrupt signal to halt an operation and initiate a system optimization routine.

18. The method of claim 16, wherein if the at least one error count does not exceed the predetermined threshold value, a corrective measure is initiated in hardware or software in the optical compact disk system.

19. The method of claim 18, wherein the corrective measure includes a change to a servo control feedback system or a reduction of disk rotation speed.

20. The method of claim 14, further comprising the step of identifying the at least one error type from a set of error types.

21. The method of claim 14, wherein storing the at least one error count is responsive to a second clocking signal.

22. The method of claim 14, wherein said receiving step includes the step of receiving multiplexed error flag signals derived from C1 error detection.

23. The method of claim 14, wherein said receiving step includes the step of receiving multiplexed error flag signals derived from C2 error detection.

* * * * *

UNITED STATES PATENT AND TRADEMARK OFFICE
CERTIFICATE OF CORRECTION

PATENT NO.    : 6,738,943 B1
DATED         : May 18, 2004
INVENTOR(S)   : Li-Huan Jen It is certified that error appears in the above-identified patent and that said Letters Patent is hereby corrected as shown below:

<u>Column 11,</u>
Line 43, remove "corrections";

<u>Column 12,</u>
Line 2, remove "operations";
Line 42, remove "corrections ether than"; and
Line 56, remove the second occurrence of "operations".

Signed and Sealed this

Twentieth Day of July, 2004

JON W. DUDAS
*Acting Director of the United States Patent and Trademark Office*